(12) United States Patent
Zheng et al.

(10) Patent No.: US 8,106,388 B2
(45) Date of Patent: *Jan. 31, 2012

(54) QUANTUM DOT SOLAR CELL WITH RIGID BRIDGE MOLECULE

(75) Inventors: Zhi Zheng, Shanghai (CN); Wei Jun Wang, Shanghai (CN); Yue Liu, Plymouth, MN (US); Linan Zhao, Shanghai (CN); Yuan Zheng, Shanghai (CN)

(73) Assignee: Honeywell International Inc., Morristown, NJ (US)

( * ) Notice: Subject to any disclaimer, the term of this patent is extended or adjusted under 35 U.S.C. 154(b) by 359 days.

This patent is subject to a terminal disclaimer.

(21) Appl. No.: 12/336,859

(22) Filed: Dec. 17, 2008

(65) Prior Publication Data

US 2009/0159131 A1   Jun. 25, 2009

Related U.S. Application Data (60) Provisional application No. 61/014,870, filed on Dec. 19, 2007.

(51) Int. Cl.
  *H01L 51/44* (2006.01)
(52) U.S. Cl. ............... 257/40; 136/263; 257/E51.015
(58) Field of Classification Search ............ 136/252, 136/263; 257/40, E51.001–E51.052; 438/82, 438/99
See application file for complete search history.

(56) References Cited

U.S. PATENT DOCUMENTS

| | | | |
|---|---|---|---|
| 4,927,721 A | 5/1990 | Gratzel et al. | |
| 5,677,545 A | 10/1997 | Shi et al. | |
| 6,566,595 B2 | 5/2003 | Suzuki | |
| 6,919,119 B2 | 7/2005 | Kalkan et al. | |
| 7,032,209 B2 | 4/2006 | Kobayashi | |
| 7,042,029 B2 | 5/2006 | Graetzel et al. | |
| 7,202,412 B2 | 4/2007 | Yamanaka et al. | |
| 7,202,943 B2 | 4/2007 | Chang et al. | |
| 7,268,363 B2 | 9/2007 | Lenhard et al. | |
| 7,462,774 B2 | 12/2008 | Roscheisen et al. | |
| 7,563,507 B2 | 7/2009 | Emrick et al. | |
| 7,655,860 B2 | 2/2010 | Parsons | |
| 2005/0028862 A1 | 2/2005 | Miteva et al. | |
| 2006/0021647 A1 | 2/2006 | Gui et al. | |

(Continued)

FOREIGN PATENT DOCUMENTS

EP    1473745    11/2004

(Continued)

OTHER PUBLICATIONS

Gebeyehu, D., et al. "Hybrid Solar Cells Based on Dye-Sensitized Nanoporous TiO2 Electrodes and Conjugated Polymers as Hole Transport Materials." SYNTH. MET., vol. 125 (2002): pp. 279-287.*
Banerjee, S. and Wong, S.S. "Synthesis and Characterization of Carbon Nanotube-Nanocrystal Heterostructures." NANOLETT., vol. 2 (2002): pp. 195-200.*
Diguna et al., "High Efficiency of CdSe Quantum-Dot-Sensitized TiO2 Inverse Opal Solar Cells," Applied Physics Letters, vol. 91, No. 023116, 3 pages, 2007.
Chang et al., "Chemical Bath Deposition of CdS Quantum Dots Onto Mesoscopic TiO2 Films for Application in Quantum-Dot-Sensitized Solar Cells," Applied Physics Letters, vol. 91, 3 pages, 2007.

(Continued)

*Primary Examiner* — Matthew W Such
(74) *Attorney, Agent, or Firm* — Seager, Tufte & Wickhem, LLC (57) ABSTRACT

A solar cell including a quantum dot, an electron conductor, and a rigid bridge molecule disposed between the quantum dot and the electron conductor. The rigid bridge molecule may include a first anchor group that bonds to the quantum dot and a second anchor group that bonds to the electron conductor. The solar cell may include a hole conductor that is configured to reduce the quantum dot once the quantum dot absorbs a photon and ejects an electron through the rigid bridge molecule and into the electron conductor.

11 Claims, 5 Drawing Sheets

U.S. PATENT DOCUMENTS

| | | | |
|---|---|---|---|
| 2006/0169971 A1 | 8/2006 | Cho et al. | |
| 2006/0263908 A1* | 11/2006 | Hirai | 436/526 |
| 2007/0025139 A1 | 2/2007 | Parsons | |
| 2007/0028959 A1 | 2/2007 | Lee et al. | |
| 2007/0062576 A1 | 3/2007 | Duerr et al. | |
| 2007/0119048 A1 | 5/2007 | Li et al. | |
| 2007/0120177 A1 | 5/2007 | McGregor et al. | |
| 2007/0122927 A1 | 5/2007 | Li et al. | |
| 2007/0123690 A1 | 5/2007 | Parham et al. | |
| 2007/0243718 A1 | 10/2007 | Shiratori et al. | |
| 2008/0110494 A1 | 5/2008 | Reddy | |
| 2008/0264479 A1 | 10/2008 | Harris et al. | |
| 2009/0114273 A1* | 5/2009 | Kamat | 136/252 |
| 2009/0159120 A1 | 6/2009 | Wang et al. | |
| 2009/0159124 A1 | 6/2009 | Mihaila et al. | |
| 2009/0159999 A1 | 6/2009 | Zheng et al. | |
| 2009/0211634 A1 | 8/2009 | Serban et al. | |
| 2009/0260682 A1 | 10/2009 | Serban et al. | |
| 2009/0260683 A1 | 10/2009 | Serban et al. | |
| 2009/0283142 A1 | 11/2009 | Serban et al. | |
| 2010/0006148 A1 | 1/2010 | Zheng et al. | |
| 2010/0012168 A1 | 1/2010 | Mihaila et al. | |
| 2010/0012191 A1 | 1/2010 | Serban et al. | |
| 2010/0043874 A1 | 2/2010 | Liu | |
| 2010/0116326 A1 | 5/2010 | Gur et al. | |
| 2010/0193025 A1 | 8/2010 | Serban et al. | |
| 2010/0193026 A1 | 8/2010 | Serban et al. | |
| 2010/0326499 A1 | 12/2010 | Liu | |

FOREIGN PATENT DOCUMENTS

| | | |
|---|---|---|
| EP | 1689018 | 8/2006 |
| EP | 1936644 | 6/2008 |
| JP | 2008177099 | 7/2008 |
| WO | WO 2004/017345 | 2/2004 |
| WO | WO 2006/099386 | 9/2006 |
| WO | WO 2006/119305 | 11/2006 |
| WO | WO 2007/098378 | 8/2007 |
| WO | WO 2007/100600 | 9/2007 |

OTHER PUBLICATIONS

U.S. Appl. No. 12/542,474, filed Aug. 17, 2009.
U.S. Appl. No. 12/433,560, filed Apr. 30, 2009.
U.S. Appl. No. 12/423,581, filed Apr. 14, 2009.
U.S. Appl. No. 12/484,034, filed Jun. 12, 2009.
U.S. Appl. No. 12/468,755, filed May 19, 2009.
U.S. Appl. No. 12/814,878, filed Jun. 14, 2010.
U.S. Appl. No. 12/614,054, filed Nov. 6, 2009.
U.S. Appl. No. 12/636,402, filed Dec. 11, 2009.
U.S. Appl. No. 12/643,829 filed Dec. 21, 2009.
U.S. Appl. No. 12/649,155, filed Dec. 29, 2009.
U.S. Appl. No. 12/690,777, filed Jan. 20, 2010.
U.S. Appl. No. 12/849,719, filed Aug. 3, 2010.
Hodes, "Chemical Solution Deposition of Semiconductor Films," Marcel Dekker Inc., 381 pages, 2002.
Lin et al., "Quantum-Dot-Sensitized Solar Cells: Assembly of CdS-Quantum-Dots Coupling Techniques of Self-Assembled Monolayer and Chemical Bath Deposition," Applied Physics Letters, vol. 90, 3 pages, 2007.
Afzal, "Studies of Cephradine Metal Interactions," 342 pages, Oct. 1998.
Anacona et al., "Synthesis and Antibacterial Activity of Cefotaxime Metal Complexes," Journal of the Chilean Chemical Society, vol. 50, No. 2, 7 pages, Jun. 2005.
Anacona et al., "Synthesis and Antibacterial Activity of Cefoxitin Metal Complexes," Transition Metal Chemistry, vol. 30, pp. 605-609, 2005.
Asbury et al., "Ultrafast Electron Transfer Dynamics from Molecular Adsorbates to Semiconductor Nanocrystalline Thin Films," Journal of Physical Chemistry B., vol. 105, No. 20, pp. 4545-4557, 2001.
Costa-Bizzarri et al., "Poly[3-Hexyl-4-(6-Bromohexyl)thiophene]: a Key-Intermediate for the Synthesis of Self-Plastifying, Multifunctional Polythiophenes," Polymer, vol. 45, pp. 8629-8637, 2004.
Diol et al., "Electron Transfer Dynamics at GaAs Surface Quantum Wells," Journal of Physical Chemistry B, vol. 102, pp. 6193-6201, 1998.
El-Maali et al., "Voltammetric Analysis of Cu (II), Cd (II) and Zn (II) Complexes and their Cyclic Voltammetry with Several Cephalsoporin Antibiotics," Bioelectrochemistry, vol. 65, pp. 95-104, 2005.
Enescu, Medicamente, pp. 292-293, 2005.
Enright et al., "Spectroscopic Determination of Electron and Hole Effective Masses in a Nanocrystalline Semiconductor Film," Journal of Physical Chemistry vol. 100, No. 3, pp. 1027-1035, 1996.
Galoppini, "Linkers for Anchoring Sesitizers to Semiconductor Nanoparticles," Coordination Chemistry Reviews vol. 248, pp. 1283-1297, 2004.
Gautam et al., "Soft Chemical Routes to Semiconductor Nanostructures," Pramana Journal of Physics, vol. 65, No. 4, pp. 549-564, Oct. 2005.
Gregg, "Excitonic Solar Cells," Journal of Physical Chemistry B., vol. 107, pp. 4688-4698, No. 20, May 1, 2003.
Hara et al., "Effect of Additives on the Photovoltaic Performance of Coumarin-Dye-Sensitized Nanocrystalline $TiO_2$ Solar Cells," Langmuir, vol. 20, No. 10, pp. 4205-4210, 2004.
http://en.wikipedia.org/wiki/Quantum_dot_solar_cell, "Nanocrystal Solar Cell," 1 page, printed Oct. 17, 2007.
http://findarticles.com/articles/mi_qa3776/is_200605ai_n17176721/print, "Ultradense GaN Nanopillar and Nanopore Arrays by Self-Assembly Nanopatterning," 4 pages, May 5, 2008.
http://www.evidenttech.com, Evident Technologies Webpages, 11 pages, printed Oct. 17, 2007.
http://www.i-sis.org.uk/QDAUESC.php, "Quantum Dots and Ultra-Efficient Solar Cells?" ISIS Press Release, Jan. 19, 2006.
Hwang et al., "A Highly Efficient Organic Sensitizer for Dye-Sensitized Solar Cells," Chemical Communications, 5 pages, printed Sep. 27, 2007.
ISBN No. 7-04-009141-0, 8 pages, 2001, 2003.
ISBN No. 978-7-03-015873-4, 8 pages, 2005.
Kay et al., "Artificial Photosynthesis. 1. Photosensitization of $TiO_2$ Solar Cells with Chlorophyll Derivatives and Related Natural Porphyrins," Journal of Physical Chemistry, vol. 97, No. 23, pp. 6272-6277, 1993.
Kim et al., "Enhanced Photocatalytic Activity in Composites of $TiO_2$ Nanotubes and Cds Nanoparticles," Chem. Commun., pp. 5024-5026, 2006.
Klimov, "Spectral and Dynamical Properties of Multiexcitons in Semiconductor Nanocrystals," ANRV, vol. 308-PC58-24, pp. 635-673, Dec. 2, 2006.
Kouklin et al., "Ultradense GaN Nanopillar and Nanopore Arrays by Self-Assembly and Nanopatterning," Journal of Electronic Materials, vol. 35, No. 5, pp. 1133-1137, May 2006.
Kuzyk, "Erratum: Physical Limits on Electronic Nonlinear Molecular Susceptibilities," Physical Review Letters, vol. 90, No. 3, 1 page, Jan. 2003.
Kuzyk, "Fundamental Limits on Third-Order Molecular Susceptibilities," Optics Letters, vol. 25, No. 16, pp. 1183-1185, Aug. 15, 2000.
Kuzyk, "Physical Limits on Electronic Nonlinear Molecular Susceptibilities," Physical Review Letters, vol. 85, No. 6, pp. 1218-1221, Aug. 7, 2000.
Lee et al., "CdSe Quantum Dot-Sensitized Solar Cells Exceeding Efficiency 1% at Full-Sun Intensity," Journal of Physical Chemistry C, vol. 112, No. 30, pp. 11600-11608, Jul. 4, 2008.
Lee et al., "Fabrication of Aligned $TiO_2$ One-Dimensional Nanostructured Arrays Using a One-Step Templating Solution Approach," The Journal of Physical Chemistry Letters B, vol. 109, No. 27, pp. 13056-13059, Jun. 2005.
Li et al., "Band-Structure-Corrected Local Density Approximation Study of Semiconductor Quantum Dots and Wires," Physical Review B., vol. 72, 15 pages, 2005.
Li et al., "Conducting Polythiophenes with a Broad Spectrum of Reactive Groups," Journal of Polymer Science A, Polymer Chemistry, vol. 43, pp. 4547-4558, 2005.

Li et al., "Review of Recent Progress in Solid-State Dye-Sensitized Solar Cells," Solar Energy Materials and Solar Cells, vol. 90, pp. 549-573, 2006.

Liang et al., "Calculation of the Vibrationally Non-Relaxed Photo-Induced Electron Transfer Rate Constant in Dye-Sensitized Solar Cells," Physical Chemistry Chemical Physics, vol. 9, pp. 853-861, 2007.

Marcus et al, "Electron Transfers in Chemistry and Biology," Biochimica et Biophysica Acta, vol. 811, pp. 265-322, 1985.

Marcus et al., "Electron Transfer Reactions in Chemistry, Theory and Experiment," Reviews of Modern Physics, vol. 65, No. 3, pp. 599-610, Jul. 1993.

Marcus, "Electrostatic Free Energy and Other Properties of States Having Nonequilibrium Polarization. I," The Journal of Chemical Physics, vol. 24, No. 5, 11 pages, May 1956.

Marcus, "On the Theory of Oxidation-Reduction Reactions Involving Electron Transfer. I," The Journal of Chemical Physics, vol. 24, No. 5, 13 pages, May 1956.

Meier et al., "Fast Electron Transfer Across Semiconductor-Molecule Interfaces: GaAs/Co(Cp)$_2$," Journal of Physical Chemistry B., vol. 103, pp. 2122-2141, 1999.

Milliron et al., "Electroactive Surfactant Designed to Mediate Electron Transfer Between CdSe Nanocrystals and Organic Semiconductors," Advanced Materials, vol. 15, No. 1, pp. 58-61, Jan. 3, 2003.

Morrison et al., Organic Chemistry, Sixth Edition, Chapter 6, pp. 240-242, 1992.

Neale et al., "Effect of a Coadsorbent on the Performance of Dye-Sensitized TiO$_2$ Solar Cells: Shielding Versus Band-Edge Movement," Journal of Physical Chemistry B., vol. 109, No. 49, pp. 23183-23189, 2005.

Nenitescu, Chimie Organica, vol. I, p. 522, 1980.

Nenitescu, Chimie Organica, vol. II, p. 581, 1980.

Nilsing et al., "Phosphonic Acid Adsorption at the TiO$_2$ Anatase (101) Surface Investigated by Periodic Hybrid HF-DFT Computations," Surface Science, vol. 582, pp. 49-60, 2005.

Nozick et al., "Quantum Dot Solar Cells," Physica E, vol. 14, pp. 115-120, 2002.

O'Reagan et al., "A Low-Cost, High Efficiency Solar Cell Based on Dye-Sensitized Colloidal TiO$_2$ Films," Nature, vol. 353, pp. 737-740, Oct. 24, 1991.

Oyaizu et al., "Linear Ladder-Type Conjugated Polymers Composed of Fused Thiophene Ring Systems," Macromolecules, vol. 37, No. 4, pp. 1257-1270, 2004.

Palomares et al., "Control of Charge Recombination Dynamics in Dye Sensitized Solar Cells by the Use of Conformally Deposited Metal Oxide Blocking Layers," Journal of the American Chemical Society, vol. 125, No. 2, pp. 475-482, 2003.

Perez-Moreno et al., "Modulated Conjugation as a Means for Attaining a Record High Intrinsic Hyperpolarizability," Optics Letters, vol. 32, No. 1, pp. 59-61, Jan. 1, 2007.

Pomerantz et al., "Synthesis and Properties of Poly[3-(w-bromoalkyl)thiophene]," Synthetic Metals, vol. 101, 1 page, 1999.

Pomerantz et al., "Sysnthesis and Study of Poly(3-hexylthiophenes) and Poly(3-dodecylthiophenes) Containing Halogen and Sulfer Substitutes in the W-Position of the Side Chain," ARKIVOC, pp. 119-137, 2003.

Qian et al., "Gallium Nitride-Based Nanowire Radial Heterostructures for Nanophotonics," NanoLetters, vol. 4, No. 10, pp. 1975-1979, 2004.

Qiu et al., "Fabrication of TiO$_2$ Nanotube Film by Well-Aligned ZnO Nanorod Array Film and Sol-Gel Process," Thin Solid Films, vol. 515, pp. 2897-2902, 2007.

Robel et al., "Quantum Dot Solar Cells, Harvesting Light Energy with CdSe Nanocrystals Molecularly Linked to Mesoscopic TiO$_2$ Films," Journal of the American Chemical Society, vol. 128, No. 7, pp. 2385-2393, 2006.

Robel et al., "Size-Dependent Electron Injection from Excited CdSeQuantum Dots into TiO$_2$ Nanoparticles," JACS Communications, 2 pages, Mar. 21, 2007.

Wang et al. "Enhance the Performance of Dye-Sensitized Solar Cells by Co-grafting Amphiphilic Sensitizer and Hexadecylmalonic Acid on TiO$_2$ Nanocrystals," Journal of Physical Chemistry B., vol. 107, No. 51, pp. 14336-14341, 2003.

Wu et al., "Superior Radiation Resistance of In$_1$-xGaxN Alloys: Full-Solar-Spectrum Photovoltaic Material System," Journal of Applied Physics, vol. 24, No. 10, pp. 6477-6482, Nov. 15, 2003.

Xu et al., "New Triphenylamine-Based Dyes for Dye-Sensitized Solar Cells," Journal of Physical Chemistry C, vol. 112, No. 3, pp. 874-880, 2008.

Yum et al., "Efficient Co-Sensitization of Nanocrystalline TiO$_2$ Films by Organic Sensitizers," Chemical Communications, 7 pages, printed Sep. 27, 2007.

Dennler et al., "Polymer-Fullerene Bulk-Heterojunction Solar Cells," Advanced Materials, vol. 21, pp. 1323-1338, 2009.

Kline et al., "Highly Oriented Crystals at the Buried Interface in Polythiophene Thin-Film Transistors," Nature Materials, vol. 5, pp. 222-228, Mar. 2006.

Peet et al., "Efficiency Enhancement in Low-bandgap Polymer Solar Cells by Processing with Alkane Dithiols," Nature Materials, Advance Online Publication, pp. 1-4, May 27, 2007.

Clarke et al., "Photophysics of Dopamine-Modified Quantum Dots and Effects on Biological Systems," Nature Materials, vol. 5, pp. 409-417, May 2006.

Huang et al., "Preparation and Application of L-Cysteine-Modified CdSe/CdS Core/Shell Nanocrystals as a Novel Flourescence Probe for Detection of Nucleic Acid," Spectrochimica Acta Part A, vol. 70, pp. 318-323, 2008.

Huber et al., "The Role of Surface States in the Ultrafast Photoinduced Electron Transfer from Sensitizing Dye Molecules to Semiconductor Colloids," Journal Phys. Chemistry B, vol. 104, No. 38, pp. 8995-9003, 2000.

Landes et al., "On the Nanoparticle to Molecular Size Transition: Flourescence Quenching Studies," vol. 105, No. 43, pp. 10554-10558, 2001.

Law et al., "ZnO-Al$_2$O$_3$ and ZnO-TiO$_2$ Core-Shell Nanowire Dye-Sensitized Solar Cells," Journal Phys. Chemistry B, vol. 110, No. 45, pp. 22652-22663, 2006.

Leschkies et al., "Photosensitization of ZnO Nanowires with CdSe Quantum Dots for Photovoltaic Devices," Nano Letters, vol. 7, No. 6, pp. 1793-1798, 2007.

Ma et al., "A Sensitive Method for the Detection of Catecholamine Based on Fourescence Quenching of CdSe Nanocrystals," Talanta, vol. 67, pp. 979-983, 2005.

Mora-Sero et al., "Factors Determining the Photovoltaic Performance of a CdSe Quantum Dot Sensitized Solar Cell: the Role of the Linker Molecule and of the Counter Electrode," Nanotechnology, vol. 19, 7 pages, 2008.

Olson et al., "The Effect of Atmosphere and ZnO Morphology on the Performance of Hybrid Poly (3-Hexylthiophene)/ZnO Nanofiber Photovoltaic Devices," Journal Phys. Chemistry C, vol. 111, No. 44, pp. 16670-16678, 2007.

Plass et al., "Quantum Dot Sensitization of Organic-Inorganic Hybrid Solar Cells," Journal Phys. Chemistry B, vol. 106, No. 31, pp. 7578-7580, 2002.

Quintana et al., "Comparison of Dye-Sensitized ZnO and TiO$_2$ Solar Cells: Studies of Charge Transport and Carrier Lifetime," pp. 1035-1041, Journal Phys. Chemistry C, vol. 111, No. 2, pp. 1035-1041, 2007 (published on web Dec. 14, 2006).

Sharma et al., "Photoinduced Charge Transfer Between CdSe Quantum Dots and p-Phenylenediamine," Journal Phys. Chemistry B, vol. 107, No. 37, pp. 10088-10093, 2003.

Snaith et al., "Self-Organization of Nanocrystals in Polymer Brushes. Application in Heterojunction Photovoltaic Diodes," Nano Letters, vol. 5, No. 9, pp. 1653-1657, 2005.

Wu et al., "Phosphate-Modified TiO$_2$ Nanoparticles for Selective Detection of Dopamine, Levodopa, Adrenaline, and Catechol Based on Flourescence Quenching," Langmuir, vol. 23, No. 14, pp. 7880-7885, 2007.

Zhai et al., "A Simple Method to Generate Side-Chain Derivatives of Regioregular Polythiophene Via the GRIM Metathesis and Post-Polymerization Functionalization," Macromolecules, vol. 36, No. 1, pp. 61-64, 2003 (published on web Dec. 14, 2002).

* cited by examiner

QUANTUM DOT SOLAR CELL WITH RIGID BRIDGE MOLECULE

PRIORITY

This application claims priority to provisional application Ser. No. 61/014,870 filed Dec. 19, 2007 entitled "QUANTUM DOT SOLAR CELL WITH RIGID BRIDGE MOLECULE", which is incorporated herein by reference.

TECHNICAL FIELD

The disclosure relates generally to solar cells and more particularly to quantum dot solar cells.

SUMMARY

The disclosure relates generally to solar cells. In an illustrative but non-limiting example, the disclosure relates to a solar cell that includes a quantum dot layer having a plurality of quantum dots, an electron conductor layer, a rigid bridge molecule layer and a hole conductor layer. The rigid bridge molecule layer may be disposed between the quantum dot layer and the electron conductor layer. The hole conductor layer may be disposed in contact with the quantum dot layer.

In another illustrative but non-limiting example, the disclosure relates to a light sensitive assembly that includes a quantum dot and an electron conductor. A rigid bridge molecule may be disposed between the quantum dot and the electron conductor. The rigid bridge molecule may include a first anchor group that bonds to the quantum dot and a second anchor group that bonds to the electron conductor.

In another illustrative but non-limiting example, the disclosure relates to a solar cell that includes a quantum dot and an electron conductor. A rigid bridge molecule is disposed between the quantum dot and the electron conductor. The rigid bridge molecule may include a first anchor group that bonds to the quantum dot and a second anchor group that bonds to the electron conductor. The solar cell may also include a hole conductor that is configured to reduce the quantum dot once the quantum dot absorbs a photon and ejects an electron through the rigid bridge molecule and into the electron conductor.

The above summary is not intended to describe each disclosed embodiment or every implementation of the disclosure. The Figures and Detailed Description which follow more particularly exemplify these embodiments.

BRIEF DESCRIPTION OF THE FIGURES

The following description should be read with reference to the drawings, in which like elements in different drawings are numbered in like fashion. The drawings, which are not necessarily to scale, depict selected embodiments and are not intended to limit the scope of the disclosure. The disclosure may be more completely understood in consideration of the following detailed description of various embodiments in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized.

Figure 1:
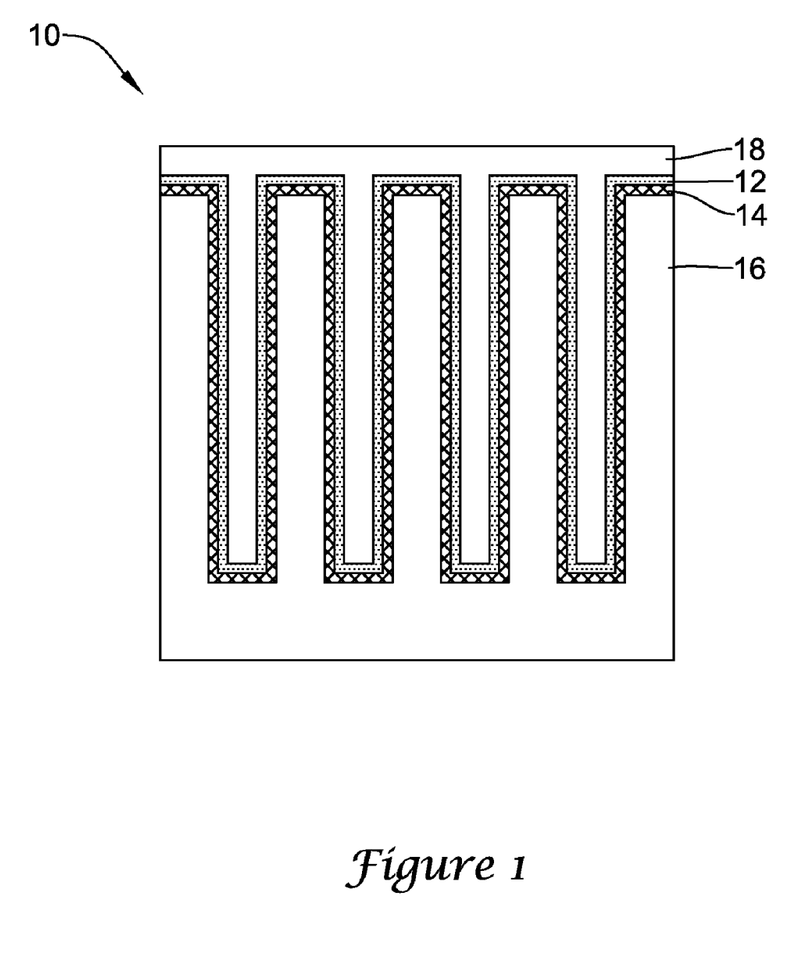
FIG. 1 is a schematic cross-sectional side view of an illustrative but non-limiting example of a solar cell.

FIG. 1 is a schematic cross-sectional side view of an illustrative solar cell 10. In the illustrative example shown in FIG. 1, there is a three-dimensional intermingling or interpenetration of the layers forming solar cell 10, but this is not required. The illustrative solar cell 10 includes a quantum dot layer 12. Quantum dot layer 12 may schematically represent a single quantum dot. In some cases, quantum dot layer 12 may be considered as representing a large number of individual quantum dots. In the illustrative embodiment of FIG. 1, a bridge layer 14 is provided, and may schematically represent a single rigid bridge molecule, such as those discussed below. In some cases, bridge layer 14 may represent a large number of individual rigid bridge molecules, with at least some of the rigid bridge molecules within bridge layer 14 bonded to corresponding quantum dots within quantum dot layer 12. The illustrative solar cell 10 also includes an electron conductor layer 16. In some cases, electron conductor layer 16 may be an n-type conductor as discussed below.

The illustrative solar cell 10 may further include a hole conductor layer 18. As discussed below, hole conductor layer 18 may be a p-type conducting electrode layer. In some instances, hole conductor layer 18 may represent an electrolyte solution that is in contact with quantum dot layer 12 such that the electrolyte solution can reduce, i.e., replace electrons, within quantum dot layer 12 when incident photons cause individual quantum dots within quantum dot layer 12 to eject electrons through bridge layer 14 and into electron conductor layer 16.

Quantum dot layer 12 may include one quantum dot or a plurality of quantum dots. Quantum dots are typically very small semiconductors, having dimensions in the nanometer range. Because of their small size, quantum dots may exhibit quantum behavior that is distinct from what would otherwise be expected from a larger sample of the material. In some cases, quantum dots may be considered as being crystals composed of materials from Groups TI-VI, III-V, or IV-VI materials. The quantum dots employed herein may be formed using any appropriate technique. Examples of specific pairs of materials for forming quantum dots include, but are not limited to, MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs and InSb. Additional examples of quantum dot materials include $CuInSe_2$, $CuS_2$, $AgS_2$, CdSe/ZnS core/shell structure, CdSe/ZnSe core/shell structure and others.

Figure 2:
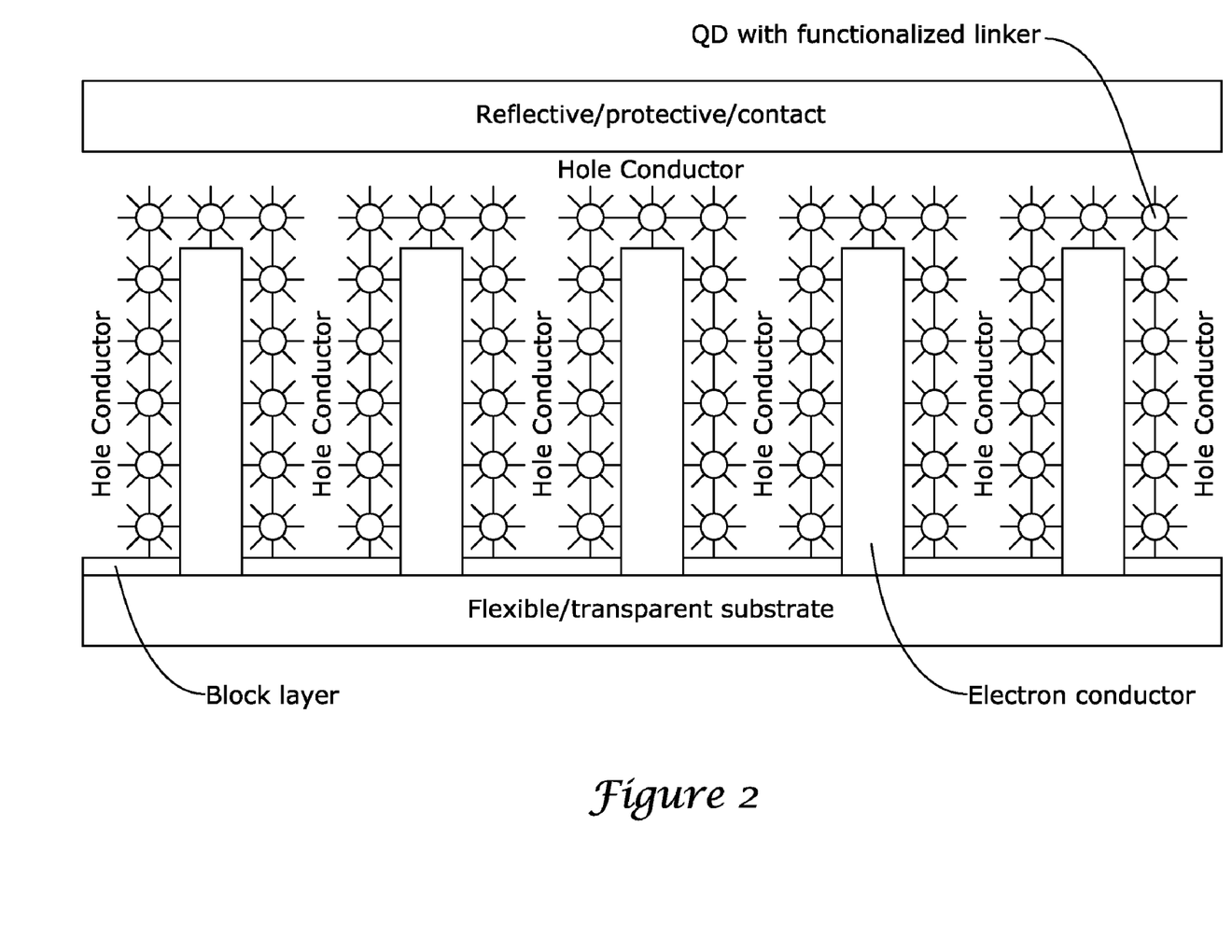
FIG. 2 is a schematic cross-sectional side view of another illustrative but non-limiting example of a solar cell.

FIG. 2 is a schematic cross-sectional side view of an illustrative solar cell that is similar to solar cell 10 (FIG. 1). In some cases, a reflective and/or protecting layer may be disposed over the hole conductor layer, as shown. The reflective and/or protecting layer may be a conductive layer. In some instances, the reflective and/or protecting layer may include a Pt/Au/C film as both catalyst and conductor, but this is not required. Alternatively, or in addition, a flexible and transparent substrate, shown at the lower side (in the illustrated orientation) of FIG. 2, may be an electron conductor such as an n-type electron conductor. The n-type electron conductor may be transparent or at least substantially transparent to at least some wavelengths of light within the visible portion of the electromagnetic spectrum.

As described with respect to FIG. 1, solar cell 10 may include a rigid bridge molecule layer 14. In some cases, rigid bridge molecule layer 14 may include a single rigid bridge molecule or a large number of rigid bridge molecules. A rigid bridge molecule may, in some cases, be considered as improving electron transfer by reducing the energy barriers for electron transfer. Rigid bridge molecules may, in some cases, improve the alignment of the quantum dots stereochemically. In some instances, a rigid bridge molecule may serve one or more purposes or functions. A rigid bridge molecule may provide a conduit so that electrons that are ejected by the quantum dot can travel to and through the electron conductor. A rigid bridge molecule may, for example, secure the quantum dot relative to the electron conductor and/or any other related structure.

A rigid bridge molecule may be considered as including several segments or portions. These segments or portions may include a first anchor group that may be considered as bonding to the quantum dot, a second anchor group that may be considered as bonding to the electron conductor and a bridge or linker portion to which the first and second anchor groups are bonded or otherwise secured. Each of these segments or portions will be discussed, in turn.

The first anchor group, which may be bonded to the bridge portion or otherwise be formed as a portion thereof, may be a molecular group or moiety that has an affinity for bonding to quantum dots. In some cases, the first anchor group may be a thiol moiety such as —SH. In some instances, the first anchor group may be an amine moiety.

The second anchor group, which may be bonded to the bridge portion or otherwise be formed as a portion thereof, may be a molecular group or moiety that has an affinity for bonding to electron conductors. In some cases, the second anchor group may be a carboxylic acid moiety. In some instances, the second anchor group may be a phosphonic acid moiety.

Several groups or types of bridge portions are contemplated. In some cases, the bridge portion may include or be formed from a bicyclic ring structure that is functionalized by the first and second anchor groups. In some instances, the first and second anchor groups may each be bonded to ring carbons that are not bonded to hydrogen. In some cases, the first and second anchor groups may each be bonded to bridgehead carbons within the bicyclic ring structure.

A variety of bicyclic ring structures are useful. In some cases, a bicyclic ring structure may include at least seven carbon atoms, and may include eight, nine, ten or more carbon atoms. A suitable bicyclic ring structure includes but is not limited to adamantane, which has the following structure:

Another suitable ring structure is bicyclo[2.2.2]octane, which has the following structure:

Another suitable ring structure is bicyclo[2.2.1]heptane, which has the following structure:

Another suitable ring structure is bicyclo[3.1.1]heptane, which has the following structure:

Another suitable ring structure is bicyclo[2.2.2]octa-2,5,7-triene, which has the following structure:

These ring structures may be functionalized to include a first anchor that bonds to quantum dots and a second anchor that bonds to the electron conductor. Merely for illustrative purposes, the following bicyclic ring structures are shown bearing a thiol moiety to bond to a quantum dot and a carboxylic acid moiety to bond to an electron conductor. It will be appreciated that other anchor moieties may also be used.

The following are illustrative but non-limiting examples of rigid bridge molecules that may be formed by, for example, functionalizing the above-referenced bicyclic ring structures:

-continued

In some cases, the rigid bridge molecule may include or otherwise be formed from a conjugated molecule that has been functionalized with the first and second anchor groups. As with the bicyclic ring structures, the first and second anchor groups may be selected to bond to quantum dots and electron conductors, respectively. Conjugated molecules may include both acyclic and cyclic conjugated molecules.

Illustrative but non-limiting examples of acyclic conjugated molecules include 3-mercaptoacrylic acid and 2-mercapto-2-propenoic acid, the structures of which are shown below. It will be recognized that the anchor groups shown on these specific molecules are to be considered as illustrative only:

An illustrative but non-limiting example of a suitable cyclic conjugated molecule includes 3,4-dihydroxybenzylamine, which has the following structure:

Another suitable rigid bridge molecule includes 4-mercaptobenzoic acid, which has the following structure:

Another suitable rigid bridge molecule includes 3-mercaptobenzoic acid, which has the following structure:

Another suitable rigid bridge molecule includes isonicotinic acid, which has the following structure:

Another suitable rigid bridge molecule includes 4,5-disulfanylanthracene-1,8-dicarboxylic acid, which has the following structure:

Another suitable rigid bridge molecule includes 2-benzothiazolethiol, which can be functionalized to include a quantum dot anchor and which has the following structure:

Another suitable rigid bridge molecule includes catechol, which can be functionalized to include a quantum dot anchor. Catechol has the following structure:

Another suitable rigid bridge molecule includes methyl catechol, which can be functionalized to include a quantum dot anchor. Methyl catechol has the following structure:

Another suitable rigid bridge molecule includes alizarin, which can be functionalized to include a quantum dot anchor and which has the following structure:

In some cases, a solar cell may include a rigid bridge molecule having a first anchor group bonded to a quantum dot and a second anchor group bonded to an electron conductor. A solar cell may include a hole conductor that is configured to reduce the quantum dot once the quantum dot has absorbed a photon and ejected an electron through the rigid bridge molecule to the electron conductor.

Referring back to FIG. 1, the illustrative solar cell 10 may include an electron conductor layer 16, which may be formed of any suitable material. In some instances, electron conductor layer 16 may be formed of a wide bandgap semiconductor. Illustrative but non-limiting examples include $TiO_2$, ZnO, $SnO_2$ and $ZnO/TiO_2$ core/shell structures. In some cases, electron conductor layer 16 may be an electrically conducting polymer such as a polymer that has been doped to be electrically conducting or to improve its electrical conductivity.

As discussed with respect to FIG. 1, the illustrative solar cell 10 may include a hole conductor layer 18. A variety of hole conductor materials are contemplated. For example, hole conductor layer 18 may be formed of a p-type electrically conductive polymer. Any suitable p-type conductive polymer may be used, such as P3HT, or poly(3-hexyl thiophene), PPP, or poly(p-phenylene), TFB, or poly(9,9-dioctylfluorene-co-N-(4-(3-methylpropyl)-diphenylamine), and the like.

In some cases, hole conductor layer 18 may be an electrolyte. An illustrative but non-limiting example of an electrolyte may be formed by dissolving suitable redox materials such as combinations of metal iodides with iodine or combinations of metal bromides with bromine. Examples of suitable metal iodides include LiI, NaI, KI, $CaI_2$ and $MgI_2$. Examples of suitable metal bromides include LiBr, NaBr, KBr and $CaBr_2$. Examples of suitable solvents include but are not limited to carbonate compounds and nitrile compounds.

In some instances, it is contemplated that the hole conductor may itself absorb light and produce excitons (electron-hole pairs). The electrons may be transferred to a conductive band of the quantum dots while the holes may be transferred to a counter electrode (anode). In these circumstances, the quantum dots have two functions. One function is to absorb photons and generate electrons and holes, as discussed above. A second function is to transfer the electrons that are generated within the hole conductor to a conductive band of the electron conductor.

An experiment was conducted to test the ability of 4-mercaptobenzoic acid (MBA) to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 0.1 ml of the CdSe solution (in hexane), 0.1 ml MBA solution (0.1 molar MBA in ethanol), 0.05 ml of titanium dioxide colloid and 0.9 ml of a 1:1 volumetric mixture of ethanol and tetrahydrofuran. The solution was allowed to react. The resultant product was centrifuged at 3000 rpm for a period of two minutes. After discarding the supernatant, the remaining pellet was tested.

Figure 3:
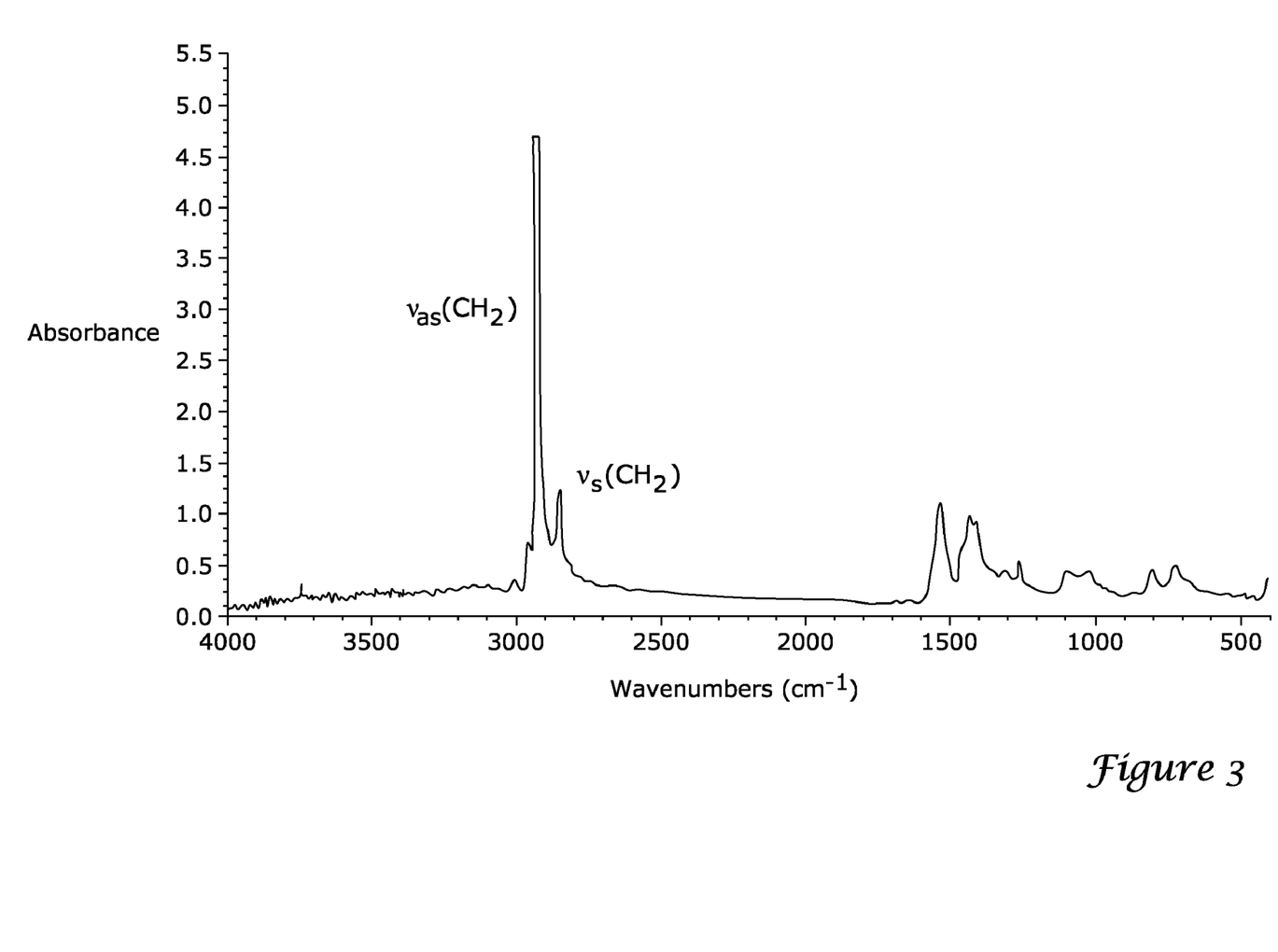
FIGS. 3 through 5 provide graphical representations of certain experimental results.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 4:
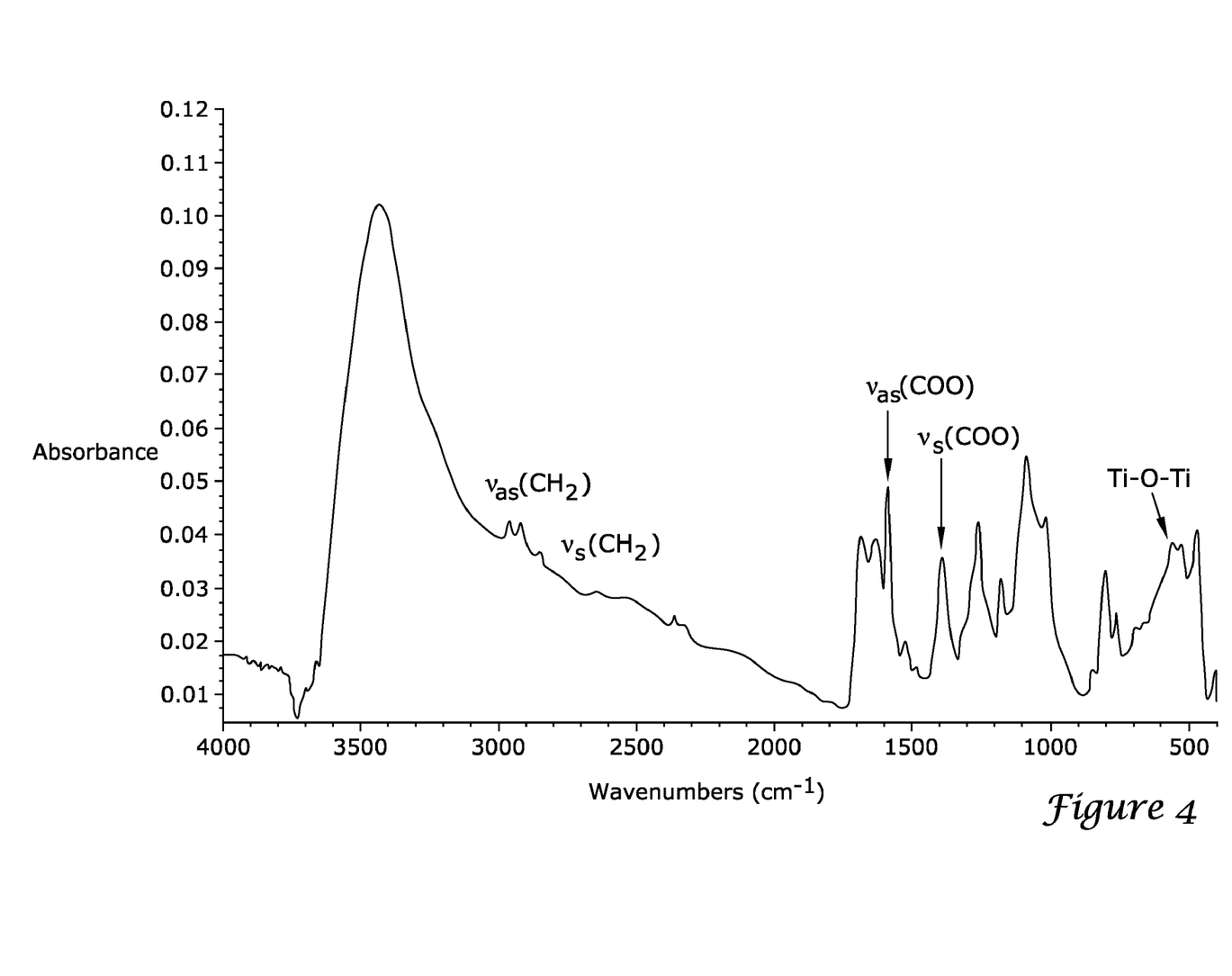

FIG. 4 provides the FTIR results pertaining to the pellet described above. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the MBA. Moreover, it can be seen that there are strong COO peaks as well as a Ti—O—Ti peak, indicating the presence of MBA on the $TiO_2$ surface.

An experiment was conducted to test the ability of 3,4-dihydroxybenzlamine to serve as a linker between a quantum dot and an electron conductor. In this particular experiment, the quantum dots tested were oleic acid-capped CdSe quantum dots, dissolved in hexane. The electron conductor tested was titanium dioxide. A solution was formed by combining 300 mg of 3,4-dihydroxybenzylamine hydrobromide with 10 ml of ethanol. A reaction solution was formed by combining 0.1 ml of the CdSe solution and 1 ml of the previously-formed dihydroxybenzylamine hydrobromide solution. The reaction solution was subjected to ultrasonic agitation for 5 minutes, and was then centrifuged at 3000 rpm for two minutes. After discarding the supernatant, the remaining pellet was tested.

In FIG. 3, which shows the FTIR results of the oleic acid-capped CdSe quantum dot prior to the above-referenced reaction, strong $(CH_2)_n$ peaks can be seen at wave numbers in the range of 2800 $cm^{-1}$ to 2900 $cm^{-1}$. This shows that there is oleic acid on the surface of the CdSe quantum dot.

Figure 5:
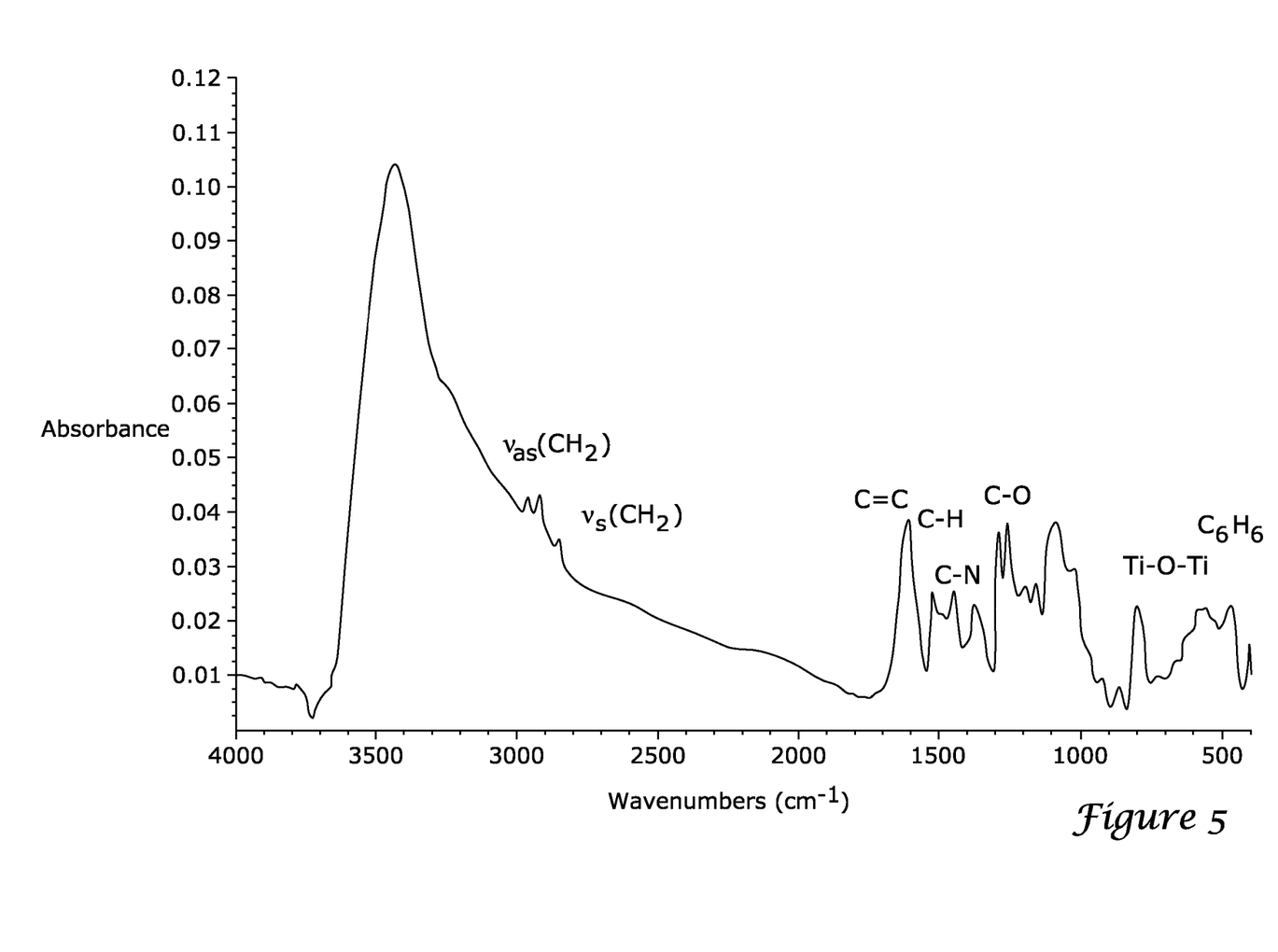

FIG. 5 provides the FTIR results pertaining to the pellet described above with respect to the 3,4-dihydroxybenzlamine linker. There are several points of interest. It can be seen that now, in contrast to that shown in FIG. 3, the strong $(CH_2)_n$ peaks that were previously seen at wave numbers in the range of 2800 $cm^{-1}$ to 2900 $cm^{-1}$ are now very weak, indicating a lack of oleic acid on the CdSe quantum dot surface. This indicates that the oleic acid was displaced by the 3,4-dihydroxybenzlamine.

Moreover, there are now a number of peaks in the 500 $cm^{-1}$ to about 1650 $cm^{-1}$ range indicating the formation of a five membered ring. In particular, the five membered ring is formed between titanium, the oxygen atoms that were originally part of the two hydroxyl groups on the dopamine, and the two ring carbons to which the hydroxyl groups were bound.

The disclosure should not be considered limited to the particular examples described above, but rather should be understood to cover all aspects of the invention as set out in the attached claims. Various modifications, equivalent processes, as well as numerous structures to which the invention can be applicable will be readily apparent to those of skill in the art upon review of the instant specification.

We claim:
1. A solar cell comprising:
   a quantum dot layer comprising a plurality of quantum dots;
   an electron conductor layer;
   a rigid bridge molecule layer disposed between the quantum dot layer and the electron conductor layer;
   a hole conductor layer in contact with the quantum dot layer;
   wherein the rigid bridge molecule layer comprises a plurality of rigid bridge molecules, at least some of the plurality of rigid bridge molecules comprising a first anchor group bonded to at least one of the plurality of quantum dots and a second anchor group bonded to the electron conductor; and
   wherein at least some of the plurality of rigid bridge molecules of the rigid bridge molecule layer are bicyclic molecules selected from the group consisting of

2. The solar cell of claim 1, wherein the electron conductor layer comprises an n-type semiconductor.
3. The solar cell of claim 1, wherein the hole conductor comprises a conductive polymer.
4. The solar cell of claim 1, wherein the hole conductor layer comprises an electrolyte.
5. The solar cell of claim 1, wherein the hole conductor layer comprises a p-type conductor.
6. The solar cell of claim 1, wherein the hole conductor layer comprises a p-type electrically conductive polymer.
7. A solar cell comprising:
   a quantum dot layer comprising a plurality of quantum dots;
   an electron conductor layer;
   a rigid bridge molecule layer disposed between the quantum dot layer and the electron conductor layer;
   a hole conductor layer in contact with the quantum dot layer;
   wherein the rigid bridge molecule layer comprises a plurality of rigid bridge molecules, at least some of the plurality of rigid bridge molecules comprising a first anchor group bonded to at least one of the plurality of quantum dots and a second anchor group bonded to the electron conductor; and
   wherein at least some of the plurality of rigid bridge molecules of the bridge molecule layer comprise

8. A solar cell comprising:
   a quantum dot layer comprising a plurality of quantum dots;
   an electron conductor layer;
   a rigid bridge molecule layer disposed between the quantum dot layer and the electron conductor layer; and
   a hole conductor layer in contact with the quantum dot layer;
   wherein the rigid bridge molecule layer comprises a plurality of rigid bridge molecules, at least some of the plurality of rigid bridge molecules comprising a first anchor group bonded to at least one of the plurality of quantum dots and a second anchor group bonded to the electron conductor; and
   wherein at least some of the plurality of rigid bridge molecules of the rigid bridge molecule layer are cyclic molecules selected from the group consisting of

9. A solar cell comprising:
   a quantum dot;
   an electron conductor;
   a rigid bridge molecule disposed between the quantum dot and the electron conductor, the rigid bridge molecule comprising a first anchor group bonded to the quantum dot and a second anchor group bonded to the electron conductor;
   a hole conductor configured to reduce the quantum dot once the quantum dot absorbs a photon and ejects an electron through the rigid bridge molecule and into the electron conductor; and
   wherein the rigid bridge molecule is a bicyclic molecule selected from the group consisting of

10. A solar cell comprising:
a quantum dot;
an electron conductor;
a rigid bridge molecule disposed between the quantum dot and the electron conductor, the rigid bridge molecule comprising a first anchor group bonded to the quantum dot and a second anchor group bonded to the electron conductor;
a hole conductor configured to reduce the quantum dot once the quantum dot absorbs a photon and ejects an electron through the rigid bridge molecule and into the electron conductor; and
wherein the rigid bridge molecule comprises

11. A solar cell comprising:
a quantum dot;
an electron conductor;
a rigid bridge molecule disposed between the quantum dot and the electron conductor, the rigid bridge molecule comprising a first anchor group bonded to the quantum dot and a second anchor group bonded to the electron conductor;
a hole conductor configured to reduce the quantum dot once the quantum dot absorbs a photon and ejects an electron through the rigid bridge molecule and into the electron conductor; and
wherein the rigid bridge molecule is a cyclic molecule selected from the group consisting of

* * * * *